(12) United States Patent
Onuki et al.

(10) Patent No.: US 8,736,734 B2
(45) Date of Patent: May 27, 2014

(54) DRIVING METHOD OF SOLID-STATE IMAGING APPARATUS AND SOLID-STATE IMAGING APPARATUS

(75) Inventors: Yusuke Onuki, Fujisawa (JP); Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 13/360,117

(22) Filed: Jan. 27, 2012

(65) Prior Publication Data

US 2012/0127355 A1    May 24, 2012

Related U.S. Application Data

(62) Division of application No. 12/437,821, filed on May 8, 2009, now Pat. No. 8,115,848.

(30) Foreign Application Priority Data

May 13, 2008  (JP) .................................. 2008-125878

(51) Int. Cl.
H04N 5/335    (2011.01)

(52) U.S. Cl.
USPC .......................................... 348/308; 348/294

(58) Field of Classification Search
USPC .................... 348/308, 294, 297, 304
See application file for complete search history.

(56) References Cited

U.S. PATENT DOCUMENTS

| 7,834,304 | B2 | 11/2010 | Oda |
| 8,115,848 | B2 * | 2/2012 | Onuki et al. ................. 348/308 |
| 2004/0051801 | A1 | 3/2004 | Iizuka et al. |
| 2007/0046795 | A1 | 3/2007 | Yamashita |
| 2008/0036890 | A1 | 2/2008 | Yamashita et al. |
| 2009/0009372 | A1 | 1/2009 | Yamashita |
| 2009/0244328 | A1 | 10/2009 | Yamashita |
| 2009/0256176 | A1 | 10/2009 | Kobayashi et al. |
| 2010/0053398 | A1 | 3/2010 | Yamashita |

FOREIGN PATENT DOCUMENTS

| JP | 2004-111590 A | 4/2004 |
| JP | 2006-246450 A | 9/2006 |
| JP | 2007-335978 A | 12/2007 |
| JP | 2008-053333 A | 3/2008 |

OTHER PUBLICATIONS

Office Action issued by the Japanese Patent Office on Nov. 19, 2013, in counterpart Japanese Appl'n. No. 2013-060268 (with partial English language translation).

* cited by examiner

*Primary Examiner* — Hung Dang
(74) *Attorney, Agent, or Firm* — Fitzpatrick, Cella, Harper & Scinto

(57) ABSTRACT

A solid-state imaging apparatus comprises a pixel portion including a plurality of pixels, wherein each pixel including a photoelectric conversion portion, an accumulation portion for accumulating the charge, a first transfer portion connecting the photoelectric conversion portion to the accumulation portion, a second transfer portion connecting the accumulation portion to a floating diffusion portion, and a third transfer portion connecting the photoelectric conversion portion to a power source, and wherein, from a state where no potential barrier is formed in the second transfer portion, a potential barrier is formed in the second transfer portion under a condition that a potential barrier is formed in the first transfer portion and no potential barrier is formed in the third transfer portion, and then a potential barrier is formed in the third transfer portion, thereby the operation of accumulating charges in the pixels is started.

20 Claims, 11 Drawing Sheets

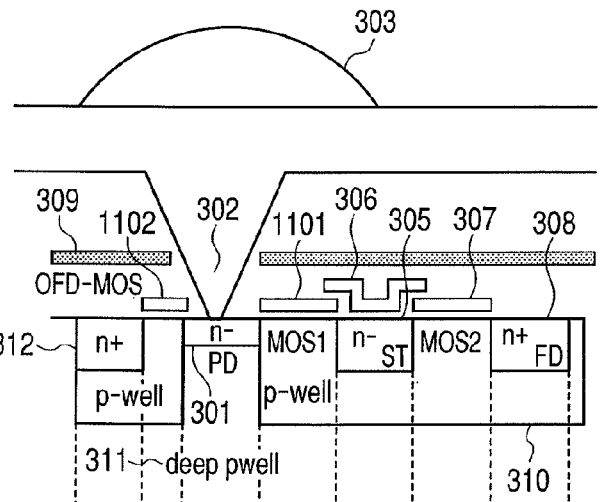
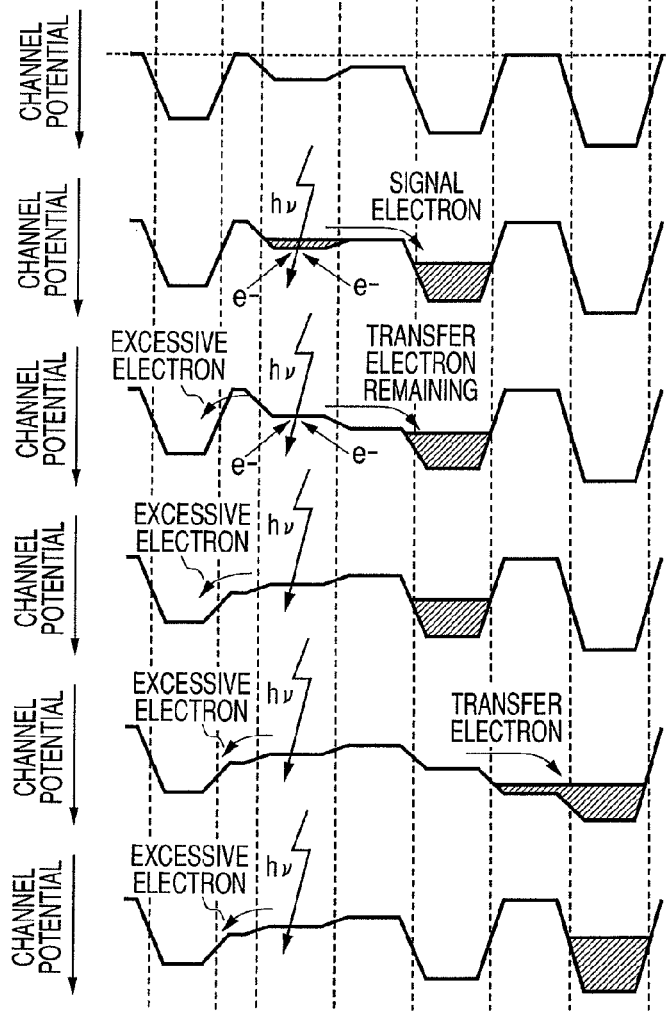
Prior Art

Prior Art t2-t4 (t8-t10)

ABD: ANTI BLOOMING DRAIN
PDS: MOS TRANSISTOR OF CONTROL SWITCH 48
PD: PHOTODIODE OF CHARGE GENERATOR 32
TF: TRANSFER GATE 46
ST: CHARGE ACCUMULATION UNIT 44

LS: READ OUT SELECTION TRANSISTOR 34
FD: FLOATING DIFFUSION 38
RS: RESET TRANSISTOR 36
RD: RESET DRAIN
DET: PIXEL SIGNAL GENERATOR 5 t4-t6 t10-t12

Prior Art

DRIVING METHOD OF SOLID-STATE IMAGING APPARATUS AND SOLID-STATE IMAGING APPARATUS

This is a division of U.S. patent application Ser. No. 12/437,821, filed May 8, 2009.

BACKGROUND OF THE INVENTION

1. Field of the Invention

The present invention relates to a solid-state imaging apparatus, an imaging system, a driving method of a solid-state imaging apparatus, all used for a scanner, a video camera, a digital still camera, and the like.

2. Description of the Related Art

With regard to a conventional imaging apparatus, a pixel configured so that a photoelectric conversion portion for photoelectrically converting an incident light may be used also as an accumulation portion for accumulating charges has been generally known.

On the other hand, Japanese Patent Application Laid-Open No. 2004-111590 discloses a technique for providing a charge accumulation portion apart from a photoelectric conversion portion. By the technique disclosed in Japanese Patent Application Laid-Open No. 2004-111590, the charges accumulated in all of the pixels in the photoelectric conversion portions are simultaneously transferred from the photoelectric conversion portions to the accumulation portions to enable the realization of a global shutter.

Moreover, Japanese Patent Application Laid-Open No. 2006-246450 discloses a configuration in which photoelectric conversion portions are provided apart from accumulation portions and most of the charges generated in the photoelectric conversion portions are not accumulated in the photoelectric conversion portions but are transferred to charge accumulating regions. FIGS. 9A-9G are quoted from FIG. 6 of Japanese Patent Application Laid-Open No. 2006-246450. The configuration disclosed in Japanese Patent Application Laid-Open No. 2006-246450 uses a metal oxide semiconductor (MOS) transistor of a buried channel structure in a transfer portion between a photoelectric conversion portion and a charge accumulation portion. Japanese Patent Application Laid-Open No. 2006-246450 describes that the photoelectric conversion portion can be restricted to the minimum size necessary for light reception. By this configuration, an in-surface synchronous electronic shutter by which the start times and the finish times of accumulations of all pixels in a surface are made to be uniform can be realized.

FIGS. 10A-10C and 11A-11C are diagrams quoted from FIGS. 2 and 5 of Japanese Patent Application Laid-Open No. 2004-111590, respectively. According to the technique disclosed in Japanese Patent Application Laid-Open No. 2004-111590, a control switch ABG for discharging the charges accumulated in a photodiode, which is a photoelectric conversion portion, to a power source $V_{DD}$ is first set to the off-state thereof. Then, an exposure-and-accumulation period is started at a time t2 in FIG. 11A, which is the timing when the operation of transferring the charges accumulated in the photoelectric conversion portion to an accumulation portion has been completed. After that, after the start of an exposure-and-accumulation period, the charges transferred to the accumulation portion are transferred to a floating diffusion FD.

However, such an operation cannot sometimes define an accumulation period in a pixel accurately. In other words, there is a case where it is impossible to grasp the period accurately in which period the charges to be accumulated in a pixel have been generated. For example, if the case where a photoelectric conversion portion is designed so as to be the minimum size necessary for light reception as disclosed in Japanese Patent Application Laid-Open No. 2006-246450 is considered, then it is apprehended that the charges generated in a photoelectric conversion portion exceed a charge quantity capable of being accumulated in the photoelectric conversion portion in the state illustrated in FIG. 11A. The charges exceeding the charge quantity capable of being accumulated in the photoelectric conversion portion are discharged to the power source $V_{DD}$ or the accumulation portion over the potential barriers formed by the control switch ABG and an FSG. That is, the problem in which an accumulation period cannot be accurately defined because a part of the charges generated after the start of the accumulation period is discharged is caused. Consequently, the driving method disclosed in Japanese Patent Application Laid-Open No. 2006-246450 cannot define the start of an accumulation period accurately in a use of generating charges more than a charge quantity that a photoelectric conversion portion can accumulate and in an imaging apparatus including a photoelectric conversion portion designed to have the minimum size necessary for light reception.

Moreover, in the operation of the configuration disclosed in Japanese Patent Application Laid-Open No. 2006-246450, which operation is illustrated in FIGS. 9A-9G, it can be considered that, after the completion of an operation of reading out the signal of a pixel at the processing illustrated in FIG. 9G, the operation is returned to the state of FIG. 9A and an accumulation operation is started. However, when the operation of the in-surface synchronous electronic shutter is performed, the start and finish times of a period of accumulating charges in pixels becomes the same times in all rows, but the read-out of signals from the pixels is performed by the row. Consequently, if the operation illustrated in FIGS. 9B-9G is repeated, then the time period of from the state illustrated in FIG. 9G to the state illustrated in FIG. 9B changes depending on rows of the pixels. If the time period changes, then dark current components accumulated in accumulation portions during the periods of from the state illustrated in FIG. 9G to the state illustrated in FIG. 9B change dependently on rows, and consequently the influences of the dark currents changes dependently on rows. Furthermore, not only the dark currents, but also the influences of lights entering the pixel region during the period change dependently on rows. Consequently, it is considerable that the brightness of an image obtained as a result changes dependently on rows. For this reason, it is considerable that false signals depending on the brightness of an object are generated, and the degradation of an image quality is feared.

SUMMARY OF THE INVENTION

The present invention is directed to provide a suitable technique for enabling the definement of a start of an accumulation period even if charges of a quantity exceeding the charge quantity capable of being accumulated in a photoelectric conversion portion are generated, and for reducing the differences of the influences of dark currents and incident lights.

A driving method of a solid-state imaging apparatus of a first aspect of the present invention is a driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer portion connecting the photoelectric conversion portion to the accumulation portion, a second transfer portion connecting the accumulation portion to a floating diffusion portion, and a third transfer portion connecting the photoelectric conversion portion to a power source, wherein, at least during a period in which the pixel accumulates the charge, a barrier formed in the first transfer portion with respect to the charge accumulated in the accumulation portion has a height not higher than a height of a barrier formed in the third transfer portion, and wherein the driving method comprises steps of: forming, from a state where no potential barrier is formed, the potential barrier in the second transfer portion, under a condition that the potential barrier is formed in the first transfer portion and no potential barrier is formed in the third transfer portion; and forming the potential barrier in the third transfer portion, to start simultaneously the operation of accumulating the charge in the pixels in a plurality of lines in the matrix of the pixels.

A driving method of a solid-state imaging apparatus of another aspect of the present invention is a driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion, a third transfer transistor for transferring the charge generated in the photoelectric conversion portion to a power source, wherein the first transfer transistor is a buried channel type transistor, and the driving method comprises steps of: changing, from a high level to a low level, a signal supplied to a control electrode of the second transfer transistor under a condition that a control electrode of the first transfer transistor is supplied with a signal of a low level while a control electrode of the third transfer transistor is supplied with a signal of a high level; and changing to a low level the signal supplied to the control electrode of the third transfer transistor, to start simultaneously the operation of accumulating the charge in the pixels in a plurality of lines in the matrix of the pixels.

A driving method of a solid-state imaging apparatus of another aspect of the present invention is a driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer portion connecting the photoelectric conversion portion to the accumulation portion, a second transfer portion connecting the accumulation portion to a floating diffusion portion and a third transfer portion connecting the photoelectric conversion portion to a power source, wherein, at least during a part of a period of accumulating the charge in the pixel, a barrier formed in the first transfer portion with respect to the charge accumulated in the accumulation portion has a height not higher than a height of a barrier formed in the third transfer portion, and wherein the driving method comprises steps of: forming, from a state where no potential barrier is formed, the potential barrier in the second transfer portion, under a condition that the potential barrier is formed in the third transfer portion and no potential barrier is formed in the first and second transfer portions, to start simultaneously the operation of accumulating the charge in the pixels in a plurality of lines in the matrix of the pixels; and forming the potential barrier in the first transfer portion.

A driving method of a solid-state imaging apparatus of another aspect of the present invention is a driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion, a third transfer transistor for transferring the charge generated in the photoelectric conversion portion to a power source, wherein the first transfer transistor is a buried channel type transistor, and the driving method comprises steps of: changing, from a high level to a low level, a signal supplied to a control electrode of the second transfer transistor under a condition that a control electrode of the third transfer transistor is supplied with a signal of a low level while control electrodes of the first and second transfer transistors are supplied with a signal of a high level, to start simultaneously the operation of accumulating the charge in the pixels in a plurality of lines in the matrix of the pixels; and changing to a low level the signal supplied to the control electrode of the first transfer transistor.

A solid-sate imaging apparatus of another aspect of the present invention is a solid-state imaging apparatus comprising: a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion and a third transfer transistor for transferring the charge generated in the photoelectric conversion portion to a power source, and a control portion for supplying a signal to control electrodes of the first, second and third transfer transistors, wherein the first transfer transistor is a buried channel type transistor; and the control portion controls to: change, from a high level to a low level, a signal supplied to the control electrode of the second transfer transistor under a condition that the control electrode of the first transfer transistor is supplied with a signal of a low level while the control electrode of the third transfer transistor is supplied with a signal of a high level; and change to a low level the signal supplied to the control electrode of the third transfer transistor, to start simultaneously the operation of accumulating the charge in the pixels in a plurality of lines in the matrix of the pixels.

A solid-state imaging apparatus of the other aspect of the present invention is a solid-state imaging apparatus comprising: a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion and a third transfer transistor for transferring the charge generated in the photoelectric conversion portion to a power source, and a control portion for supplying a signal to control electrodes of the first, second and third transfer transistors, wherein the first transfer transistor is a buried channel type transistor; and the control portion controls to: change, from a high level to a low level, a signal supplied to the control electrode of the second transfer transistor under a condition that the control electrode of the third transfer transistor is supplied with a signal of a low level while the control electrodes of the first and second transfer transistors are supplied with a signal of a high level, to start simultaneously the operation of accumulating the charge in the pixels in a plurality of lines in the matrix of the pixels; and change to a low level the signal supplied to the control electrode of the first transfer transistor.

According to the present invention, the start of an accumulation period can be suitably defined even if charges of a quantity exceeding the charge quantity capable of being accumulated in a photoelectric conversion portion are generated.

Further features of the present invention will become apparent from the following description of exemplary embodiments with reference to the attached drawings.

BRIEF DESCRIPTION OF THE DRAWINGS

FIGS. 9A, 9B, 9C, 9D, 9E, 9F, and 9G are diagrams quoted from FIG. 6 of Japanese Patent Application Laid-Open No. 2006-246450.

DESCRIPTION OF THE EMBODIMENTS (First Embodiment)

Figure 1:
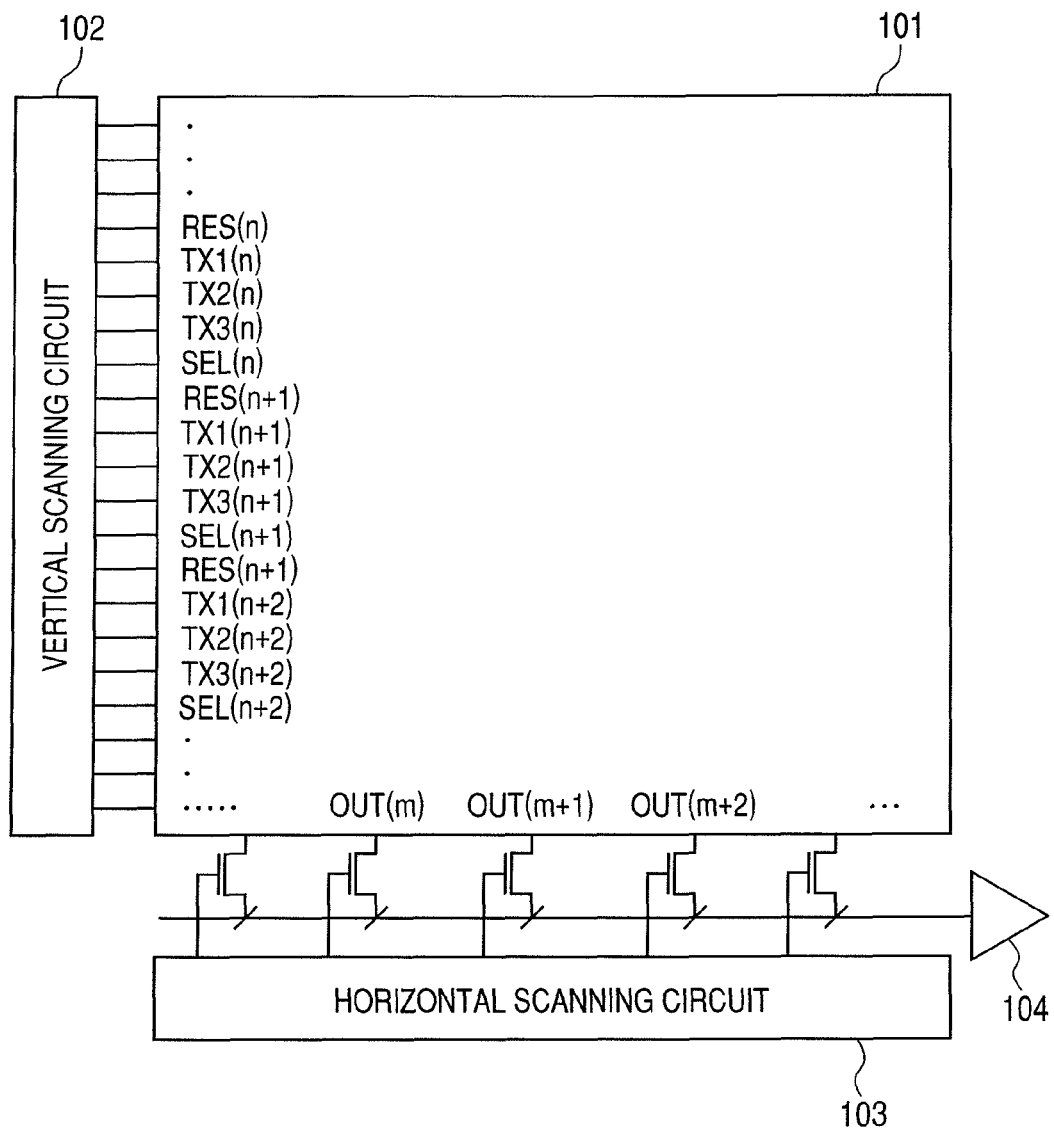
FIG. 1 is a view illustrating a schematic configuration of a solid-state imaging apparatus according to an exemplary embodiment of the present invention.

A first embodiment to which the present invention can be applied is described. FIG. 1 is a schematic block diagram of a solid-state imaging apparatus, which includes an imaging region 101, in which a plurality of pixels are arranged, and a vertical scanning circuit 102 and horizontal scanning circuit 103, which are control portions. The pixels arranged in the imaging region 101 are supposed to be arranged in a matrix here. The horizontal scanning circuit 103 sequentially scans the signal lines provided correspondingly to the columns of the pixels in the imaging region 101 to make an output circuit 104 output the signals from the pixels for a row.

Figure 2:
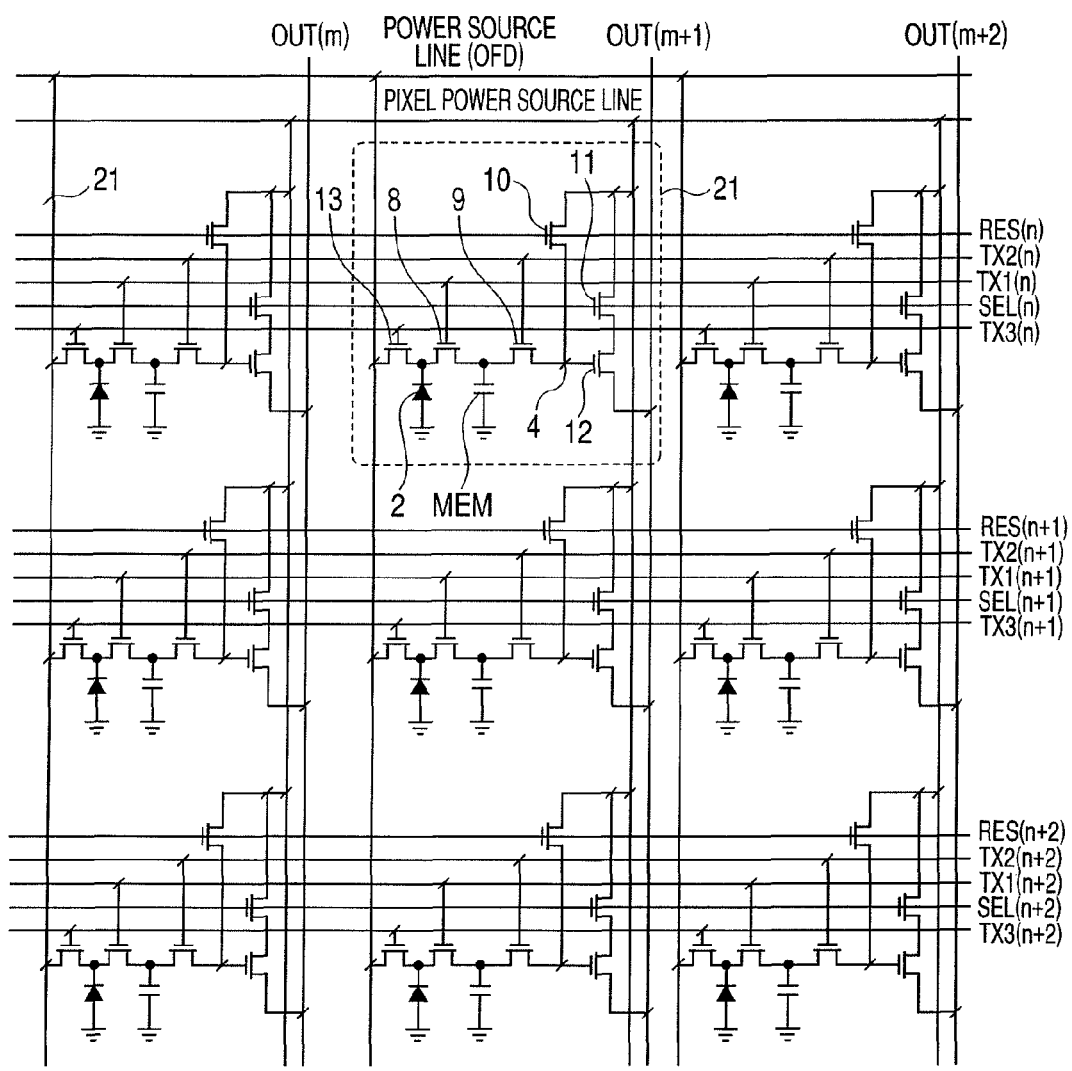
FIG. 2 is an equivalent circuit diagram of pixels according to the exemplary embodiment of the present invention.

FIG. 2 is an equivalent circuit diagram of the pixels included in the imaging region 101. For the sake of the simplification of description, a region composed of nine pixels of three rows by three columns of the pixels included in the imaging region 101 is taken as an example, but the number of the pixels is not limited to the nine. The anode of a photodiode (PD) 2, which is a photoelectric conversion portion, is grounded to fixed potential, and the cathode of the photodiode 2 is connected to one terminal of an accumulation portion MEM through a first transfer switch 8, which is a first transfer portion. The cathode is further connected to a power source line, which is a second power source functioning as an overflow drain (hereinafter referred to as an OFD), through a third transfer switch 13, which is a third transfer portion. The other terminal of the accumulation portion MEM is grounded to the fixed potential. The one terminal of the accumulation portion MEM is further connected to the gate terminal of an amplifying transistor 12 through a second transfer switch 9, which is a second transfer portion. The gate terminal of the amplifying transistor 12 is connected to a pixel power source line through a reset transistor 10, which is a reset portion. An example in which the first to third transfer portions are composed of transistors is illustrated here. Although the power source lines, which function as the OFD's, and the pixel power source lines are separated in FIG. 2, these lines may be connected to a common power source, or may be connected to different power sources.

The drain terminal, which is one main electrode, of a selection transistor 11 is connected to the pixel power source line, and the source terminal, which is the other main electrode, of the selection transistor 11 is connected to the drain, which is one main electrode, of the amplifying transistor 12. When an active signal SEL is input into the control electrode of the selection transistor 11, both of the main electrodes of the selection transistor 11 become their conduction states. The amplifying transistor 12 hereby forms a source follower circuit together with a constant current source (not illustrated) provided to the corresponding vertical signal line OUT, and a signal according to the electric potential of the gate terminal, which is the control electrode, of the amplifying transistor 12 appears on the vertical signal line OUT. A signal is output from the solid-state imaging apparatus on the basis of the signal appearing on the vertical signal line OUT, and the signal is displayed as an image through a signal processing circuit unit described below. Moreover, a node (hereinafter referred to as FD) 4, which is a floating diffusion portion to which the gate terminal of the amplifying transistor 12 and the main electrodes of the reset transistor 10 and second transfer switch 9 are commonly connected, has a capacitance value, and can hold charges.

Figure 3:
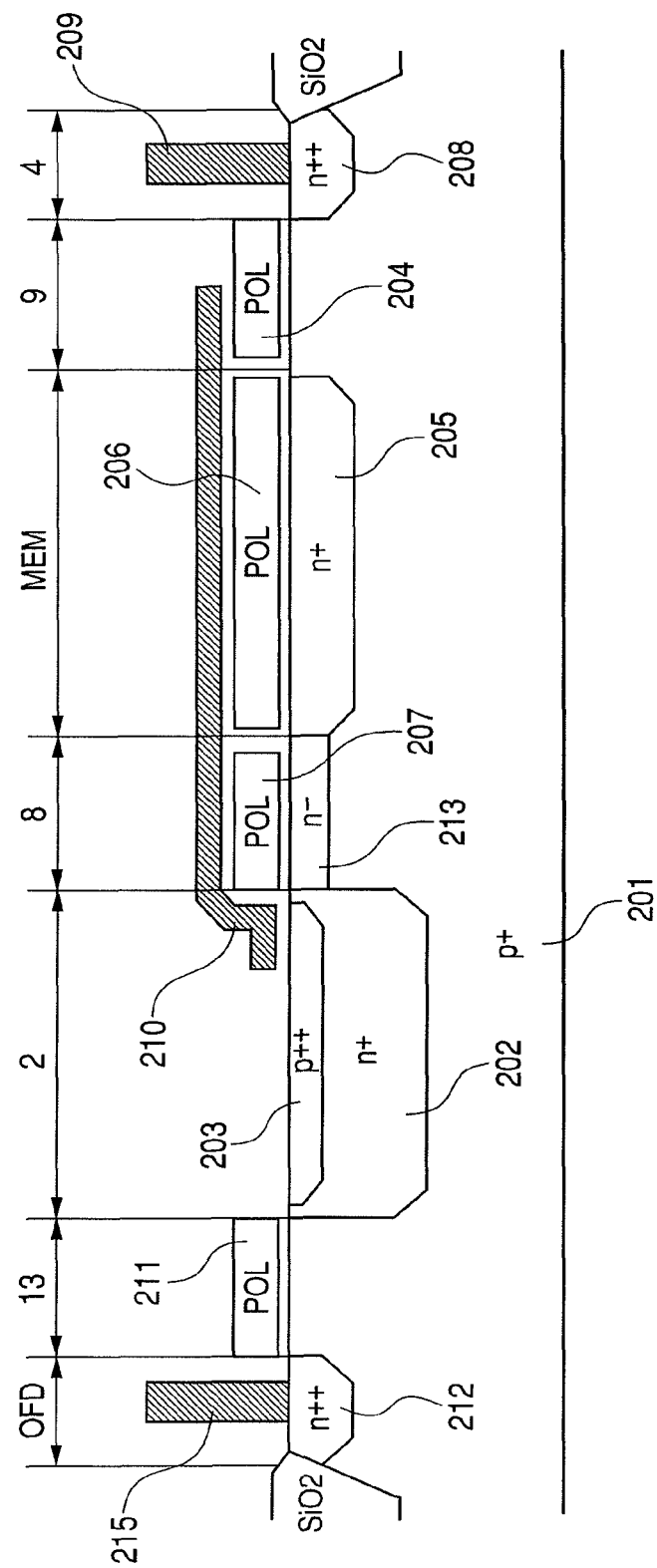
FIG. 3 is a sectional view of a pixel illustrated in FIG. 2.

Next, an example of a sectional view of the case of forming a pixel illustrated in FIG. 2 on a semiconductor substrate is illustrated in FIG. 3. In FIG. 3, the configurations corresponding to the respective configuration portions of FIG. 2 are denoted by the same reference characters as those of FIG. 2. The conductivity types of semiconductor regions are described by exemplifying the case where electrons are used as signal charges here as an example. In the case of using holes, the conductivity type of each of the semiconductor regions may be set to be a reverse conductivity type.

The pixel includes a P type semiconductor region 201. The P type semiconductor region 201 can be formed by injecting P type impurity ions into an N type semiconductor substrate, or may be formed by using a P type semiconductor substrate.

The pixel includes an N type semiconductor region (first conductivity type first semiconductor region) 202 constituting a part of a photoelectric conversion portion. The N type semiconductor region 202 has the same polarity as that of an electron, which is a signal charge. The N type semiconductor region 202 forms a PN junction together with a part of the P type semiconductor region 201 (second conductivity type second semiconductor region).

The pixel includes a P type semiconductor region 203 formed on the surface of the N type semiconductor region 202. The P type semiconductor region 203 is provided in order to make the photoelectric conversion portion a buried-type photodiode, and reduces the influences of an interface state to suppress the generation of dark currents generated on the surface of the photoelectric conversion portion. The photoelectric conversion portion is configured to include at least the first semiconductor region 202 and the second semiconductor region 201 forming the PN junction together with the first semiconductor region 202.

The pixel includes a second transfer electrode 204 constituting the second transfer switch 9. The potential state between an accumulation portion and a charge voltage converting portion (fourth semiconductor region described below) can be controlled by a voltage supplied to the second transfer electrode 204. The second transfer electrode 204 is arranged over a second path between a third semiconductor region 205 described below and the fourth semiconductor region with an insulation film put between the second transfer electrode 204 and the second path.

The pixel includes an N type semiconductor region (first conductivity type third semiconductor region) 205 constituting a part of the accumulation portion MEM. By the provision of the third semiconductor region 205, the pixel is configured to be able to accumulate the charges transferred from the photoelectric conversion portion for a certain period. The pixel includes a control electrode 206. The control electrode 206 is arranged over the third semiconductor region 205 with an insulation film put between the control electrode 206 and the third semiconductor region 205 to enable the control of the potential state in the third semiconductor region 205 in the neighborhood of the interface of the insulation film. The influences of the dark currents generated in the neighborhood of the interface of the surface oxide film of the N type semiconductor region 205 can be reduced by supplying a voltage to the control electrode 206 during a period in which the accumulation portion MEM holds charges. As described below, the voltage supplied at this time can be set to be a negative voltage in order to collect holes into the interface between the third semiconductor region 205 and the insulation film, and, for example, a voltage of about −3 V is supplied. The voltage is suitably changed according to the impurity density of the third semiconductor region 205.

The accumulation portion MEM is configured to include the N type semiconductor region 205 and the control electrode 206.

The pixel includes a first transfer electrode 207 constituting the first transfer switch 8. By the provision of the first transfer electrode 207, the pixel can control the potential state of a first path between the photoelectric conversion portion and the accumulation portion MEM. The pixel includes a semiconductor region 213 having a density lower than that of the first semiconductor region 202 between the first semiconductor region 202 and the third semiconductor region 205 under the first transfer electrode 207. By the configuration including such a buried channel, the potential relations as illustrated in FIG. 5 can be realized.

The pixel includes a floating diffusion region (FD region) 208. The FD region 208 functions as the charge voltage converting portion. The FD region 208 is electrically connected to the gate of the amplifying MOS transistor 12 through a plug 209 or the like.

The pixel includes a light blocking film 210. The light blocking film 210 is arranged lest an incident light should invade the charge accumulation portion MEM. The light blocking film 210 is required to cover at least the accumulation portion MEM, and the light blocking film 210 can be arranged to extend over the whole first transfer electrode 207 and a part of the second transfer electrode 204 to enable the light blocking function thereof to be raised.

The pixel includes a charge discharging control electrode 211 constituting the third transfer switch 13. The charge discharging control electrode 211 enables the control of the potential state of a third path between the photoelectric conversion portion and the OFD region. The charge discharging control electrode 211 is arranged over the third path with an insulation film put between the charge discharging control electrode 211 and the third path. The potential state of the third path is controlled so that the charges generated in the photoelectric conversion portion by an incident light can be discharged to the OFD region. The length of the accumulation period (exposing period) in the photoelectric conversion portion can be controlled by the voltage supplied to the charge discharging control electrode 211.

The pixel includes a part (fifth semiconductor region) 212 constituting the OFD, and a plug 215 for supplying a power source voltage to the part 212, which plug 215 is connected to a power source (not illustrated). That is, the part 212 and the plug 215 are included to the second power source.

The first transfer switch 8 constitutes a first transfer transistor together with the photoelectric conversion portion and the accumulation portion MEM. Moreover, the second transfer switch 9 constitutes a second transfer transistor together with the accumulation portion MEM and the floating diffusion portion 4. Then, the third transfer switch 13 constitutes a third transfer transistor together with the photoelectric conversion portion and the second power source.

A plurality of unit pixels described with reference to FIGS. 2 and 3 is preferably arranged in two dimensions to constitute the imaging region 101 of the solid-state imaging apparatus. In the pixels, the reset portion, the amplifying portion, the selecting portion, and the like can be shared by a plurality of photoelectric conversion portions.

Figure 4:
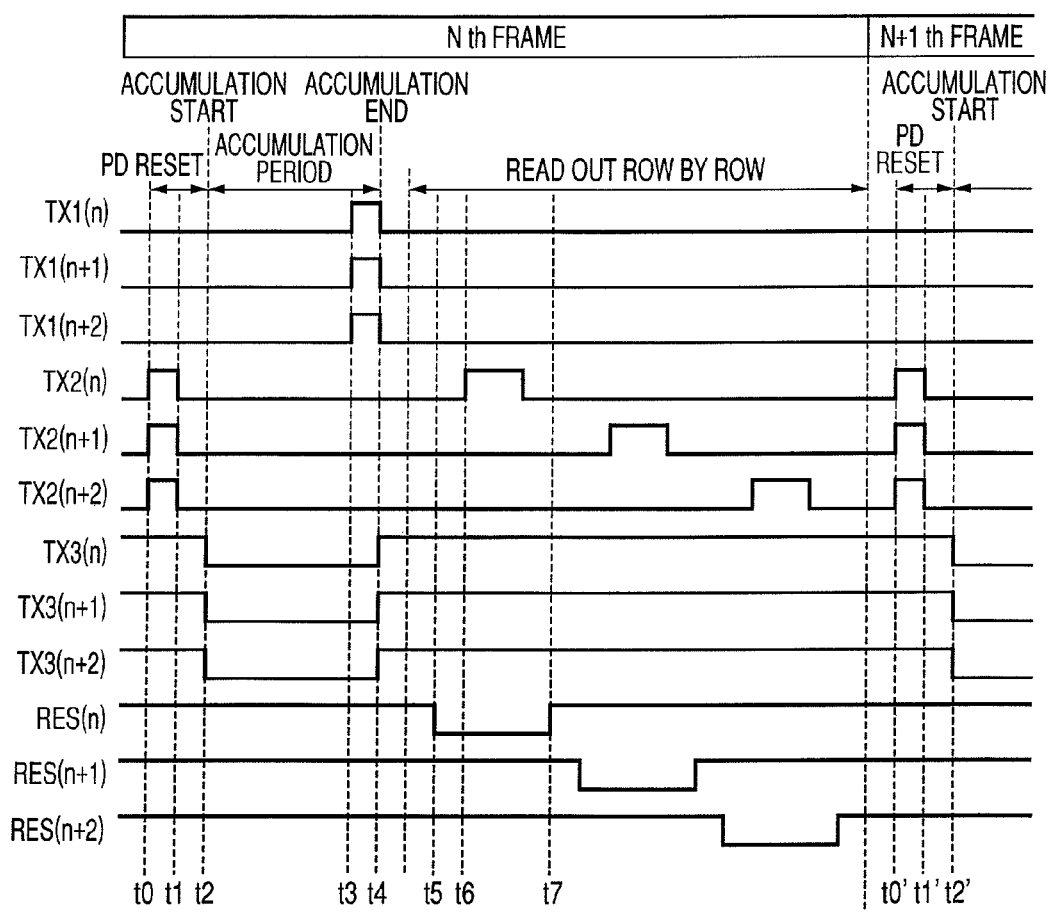
FIG. 4 is a timing chart according to a first embodiment.

Next, the operation of the present embodiment is described. FIG. 4 is a timing chart for describing the operation of the present embodiment, FIGS. 5A-5F are diagrams illustrating the potential state of a pixel at each timing of from the time just before a time t0 to the end of the accumulation period among the timings illustrated in FIG. 4. An example in which the transistor configured of the photodiode 2, a signal TX1, and the accumulation portion MEM is a buried channel type transistor is exemplified to be described here.

FIG. 4 illustrates the transitions of the signals TX1 to TX3, which are given to the control electrodes of the first to third transfer portions, respectively, and the signals RES given to the control electrodes of the reset portions. The suffixes n, n+1, and n+2 indicate the number of rows in the imaging region 101, and for example, TX1(n) indicates a signal to be given to the first transfer portions in the pixels in an $n^{th}$ row. That is, when the signal TX1(n) becomes a high level, then the first transfer portions in the pixels included in the row (line) are made to be active in a lump.

Figure 5A:
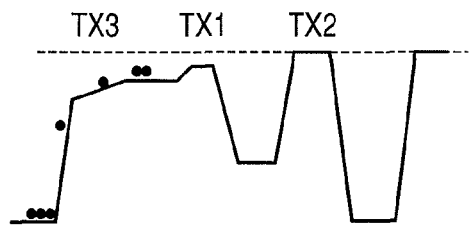
FIGS. 5A, 5B, 5C, 5D, 5E, and 5F are diagrams illustrating the potential states of a pixel according to the first embodiment.

First, in the initial state before the time t0, signals TX1(n)-TX1(n+2), signals TX2(n)-TX2(n+2) are at a low level, and signals TX3(n)-TX3(n+2) and signals RES(n)-RES(n+2) are a high level. The potential state of a pixel at this time is illustrated in FIG. 5A. In this period, there is a potential barrier formed in the signal TX1 corresponding to the first transfer portion to the charges to be accumulated in the accumulation portion MEM. On the other hand, since there are no potential barriers in the signal TX3 corresponding to the third transfer portion, the charges (black dots in FIG. 5A) generated in the photodiode (PD) 2 do not move to the accumulation portion MEM and are discharged to the OFD through the third transfer portion. Consequently, the pixel is in the state of not accumulating any charges. As being apparent from the FIG. 5A, charges do not depend on the potential state in the signal TX2. The reason why the potential barrier formed in the signal TX1 is lower than the potential barrier formed in the signal TX2 is that the example in which the transistor composed of the photodiode 2, the signal TX1, and the accumulation portion MEM is the buried channel type one is considered here.

In a period of from the time t0 to a time t1, the signals TX2(n)-TX2(n+2) become the high level. Consequently, the potential barrier formed in the signal TX2 corresponding to the second transfer portion between the accumulation portion MEM and the FD region (FD) disappears. Hereby, the charges held in the accumulation portion MEM before the time t0 are transferred to the FD region. The potential state of the pixel in this period is illustrated in FIG. 5B. Since the signals TX1(n)-TX1(n+2) are at the low level and the signals TX3(n)-TX3(n+2) are at the high level in this period, the charges generated in the photodiode 2 are discharged to the OFD through the third transfer portion. Consequently, the charges generated in the photodiode 2 cannot ideally exist in the accumulation portion MEM at this time point.

Figure 5D:
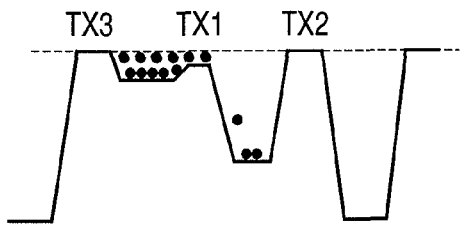
Figure 5B:
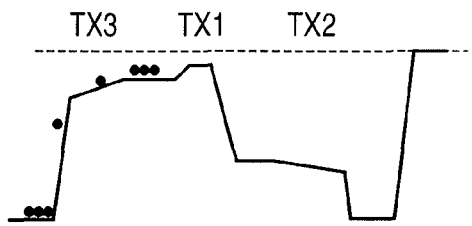
Figure 5E:
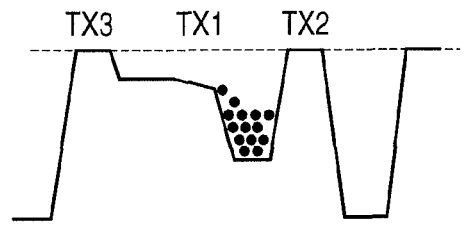
Figure 5C:
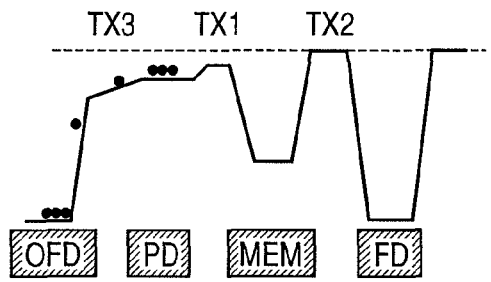

When the signals TX1(n)-TX1(n+2) become the low level at the time t1, then the potential state of the pixel becomes the one as illustrated in FIG. 5C. The potential state is the same as the one illustrated in FIG. 5A. Also in this period, the potential barrier formed in the signal TX1 corresponding to the first transfer portion exists, and on the other hand no potential barriers exist in the signal TX3 corresponding to the third transfer portion. Consequently, the charges generated in the photodiode 2 do not move to the accumulation portion MEM, but are discharged to the OFD through the third transfer portion.

Next, when the signals TX3(n)-TX3(n+2) change to the low level at the time t2, then the potential state of the pixel becomes the one illustrated in FIG. 5D. In this period, the potential barrier to the charges accumulated in the accumulation portion MEM is higher in the signal TX3 corresponding to the third transfer portion than the one in the signal TX1 corresponding to the first transfer portion. Then, since the signals TX2(n)-TX2(n+2) are at the low level, the charges exceeding the potential barrier in the signal TX1 among the charges generated in the photodiode 2 in this period stay in the photodiode 2 or the accumulation portion MEM. Consequently, an accumulation period of each of the pixels starts from the timing when the signals TX3(n)-TX3(n+2) change to the low level at the time t2. That is, in the present embodiment, from the state in which the signal TX1 is at the low level and the signal TX3 is at the high level at the time t0, the state changes to the one in which the signal TX2 changes from the high level to the low level at the time t1 and further the signal TX3 changes to the low level at the time t2. The start of the operation of accumulating charges in a pixel is hereby defined. By such a driving method, even if more charges than the quantity that the photodiode 2 can accumulate are generated in the photodiode 2, it is not performed to discharge the accumulated charges together with the unnecessary charges like the operation disclosed in Japanese Patent Application Laid-Open No. 2004-111590, and consequently the start of an accumulation period can be suitably defined.

Next, when the signals TX1(n)-TX1(n+2) change to the high level during the period of from a time t3 to a time t4, then the potential barrier formed in the first transfer portion disappears, and the charges generated in the photodiode 2 are transferred to the accumulation portion MEM (see FIG. 5E).

Figure 5F:
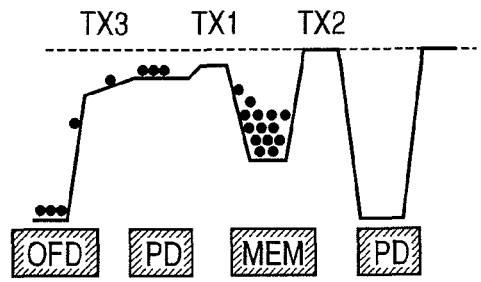

When the signals TX3(n)-TX3(n+2) change to the high level at the time t4 in place of the changes of the signals TX1(n)-TX1(n+2) to the low level, the potential state of the pixel becomes the one illustrated in FIG. 5F. Since the charges generated in the photodiode 2 at and after the time t4 are discharged to the OFD through the third transfer portion, the accumulation periods of all of the pixels end at the time t4.

By transferring the charges from the photodiodes 2 to the accumulation portions MEM in common in all of the pixels in such a way, the start times and finish times of the accumulations of all of the pixels can be made to be uniform, and an in-surface synchronous electronic shutter operation can be realized.

Next, when the signal TX2(n) changes to the high level at a time t6 during the period of from a time t5 to a time t7, during which a signal RES1(n) is at the low level, then the charges held in the accumulation portion MEM of each of the pixels in the $n^{th}$ row are transferred to the FD region of the pixel through the second transfer portion TX2. The selecting portion of the pixel is in its on-state at least at this timing, and the voltage level according to the charge quantity transferred to the FD region appears onto a corresponding vertical signal line by the source follower circuit composed of the amplifying transistor 12 and the constant current source. The signal according to the voltage level appearing on the vertical signal line is output from the output circuit 104.

Similar operations are performed also to the $(n+1)^{st}$ row pixels and the $(n+2)^{nd}$ row pixels, and the signals corresponding to the pixels in the respective rows are output from the output circuit 104. The operation for one frame is completed by the above operations.

Although the signals RES keep the high level except for the periods of reading out signals from the pixels in each of the rows in the operation illustrated in FIG. 4, the signals RES may be changed to the high level in pulses before the signals TX2 change to the high level.

The operation disclosed in Japanese Patent Application Laid-Open No. 2004-111590 has the problem of the impossibility of defining the starts of the accumulation periods of pixels suitably because, when more charges than the quantity capable of being accumulated in a photodiode are generated in the photodiode, the generated charges are discharged as unnecessary charges. That is, by the operation, it cannot be accurately grasped which period the charges accumulated in a pixel was generated in. On the other hand, by performing the aforesaid operation, even if charges are generated in a photodiode more than the quantity capable of being accumulated in the photodiode, the start of the accumulation period of the charges can be suitably defined.

Figure 10A:
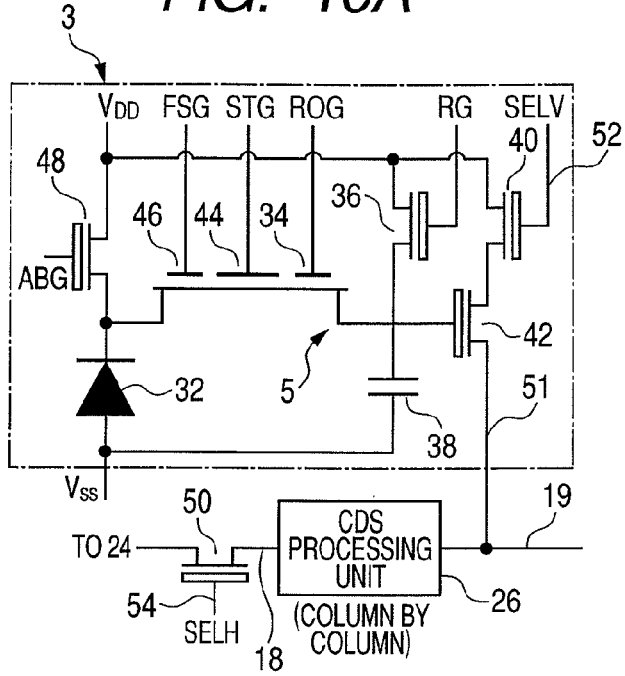
FIGS. 10A, 10B, and 10C are diagrams quoted from FIG. 2 of Japanese Patent Application Laid-Open No. 2004-111590.
Figure 10B:
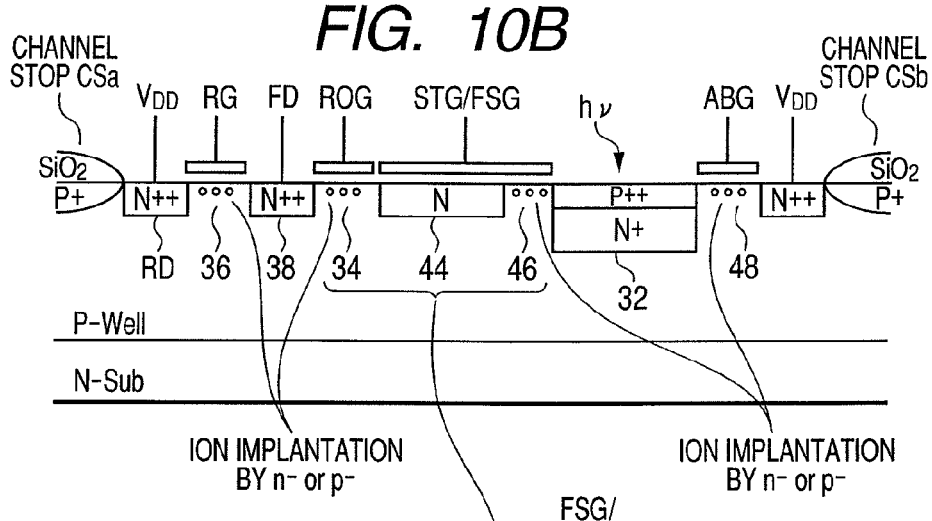
Figure 10C:
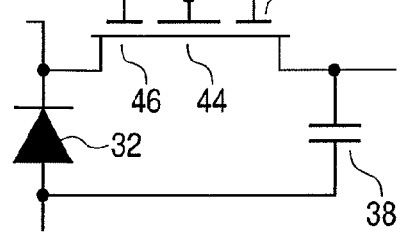
Figure 11A:
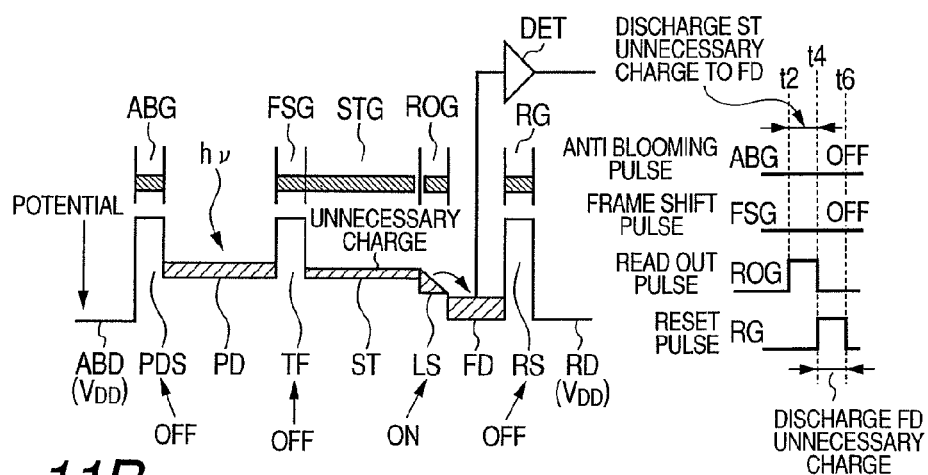
FIGS. 11A, 11B, and 11C are diagrams quoted from FIG. 5 of Japanese Patent Application Laid-Open No. 2004-111590.
Figure 11B:
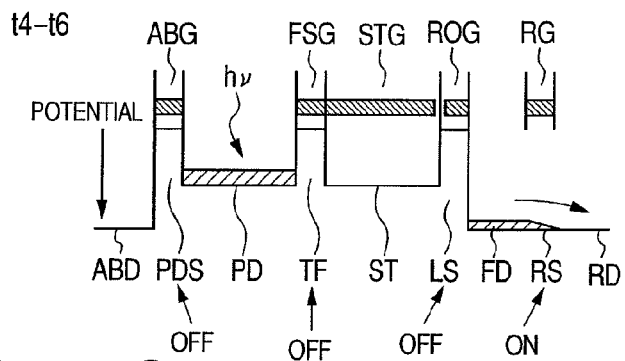
Figure 11C:
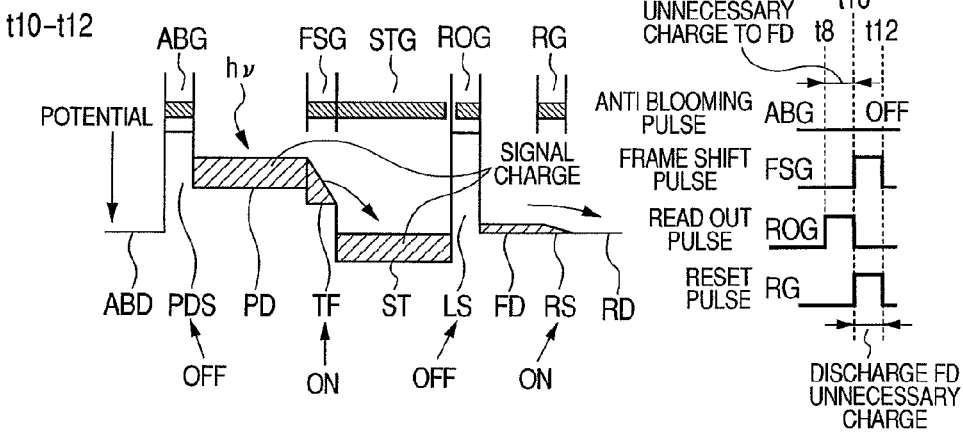

Moreover, according to Japanese Patent Application Laid-Open No. 2006-246450, it can be considered that the operation illustrated in from FIG. 9G to FIG. 9B is simultaneously performed in a plurality of lines of pixels arranged in a matrix. In that case, although the start of an accumulation period can be defined, it is apprehended that streaky noises are generated owing to the differences of the influences of dark currents and incident lights because the periods from FIG. 10G to FIG. 10A are different from one another. On the other hand, according to the present embodiment, the differences of the influences of dark currents and incident lights can be reduced.

(Second Embodiment)

Figure 6:
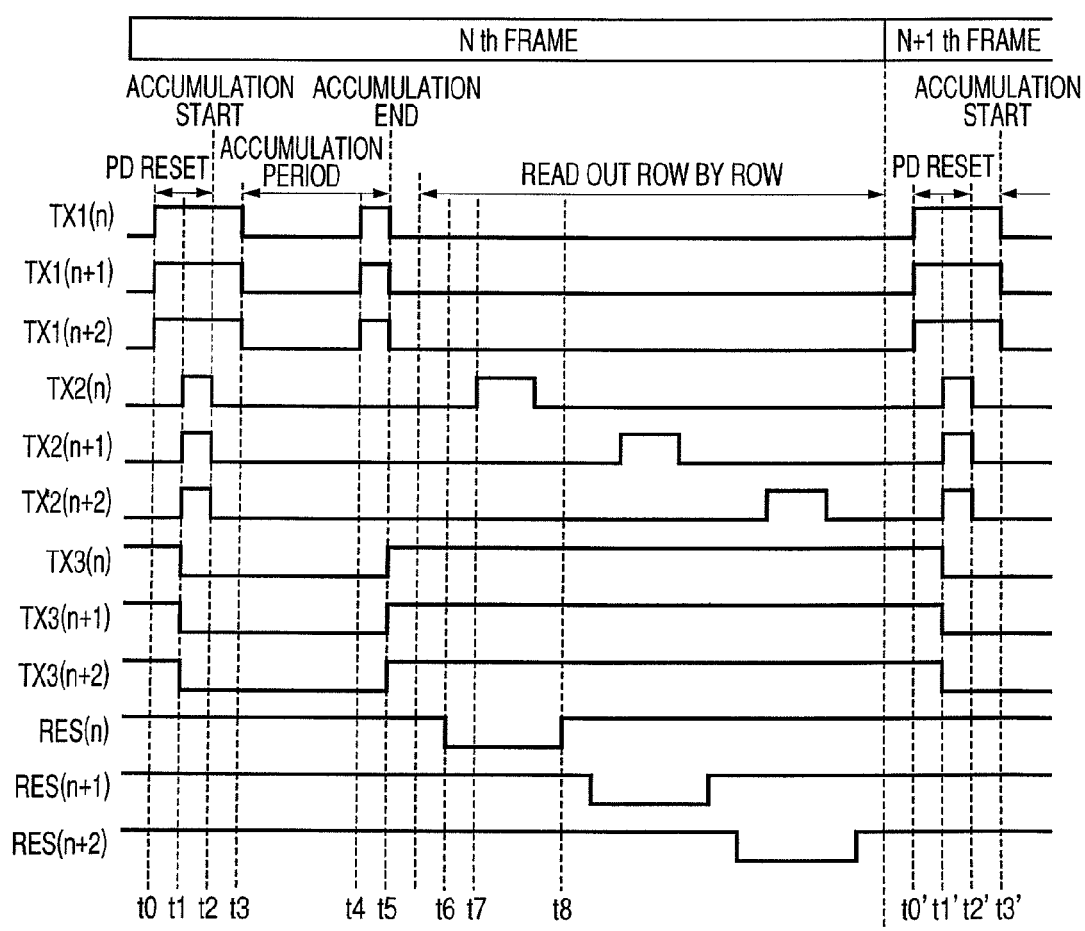
FIG. 6 is a timing chart according to a second embodiment.

The operation of a second embodiment of the present invention is described. FIG. 6 is a timing chart for describing the operation of the present embodiment, and FIGS. 7A-7G are diagrams schematically illustrating the potential state of a pixel at each timing of from the time just before the time t0 to the end of an accumulation period among the timings illustrated in FIG. 6. A case where the transistor composed of the photodiode 2, the signal TX1, and the accumulation portion MEM is a buried channel type transistor is exemplified to be described also in the present embodiment.

FIG. 6 illustrates the transitions of the signals TX1 to TX3, which are given to the first to third transfer portions, respectively, and the signals RES given to the reset portions. The suffixes n, n+1, and n+2 indicate the number of rows in the imaging region 101 similarly to FIG. 4, and for example, TX1(n) indicates a signal to be given to the first transfer portions in the pixels in a first row.

First, before the time t0, it is supposed that the signals TX1(n)-TX1(n+2) to be supplied to the first transfer portions TX1 and the signals TX2(n)-TX2(n+2) to be supplied to the second transfer portions Tx2 are at the low level. Furthermore, it is supposed that the signals TX3(n)-TX3(n+2) to be supplied to the third transfer portions TX3 and the signals RES(n)-RES(n+2) to be supplied to the reset portions RES are the high level. The potential state of a pixel at this time is the one illustrated in FIG. 7A. Since there is a potential barrier between the photodiode (PD) 2 and the accumulation portion MEM, the charges (expressed by black dots) generated in the photodiode 2 are discharged into the OFD. Moreover, although it is not illustrated in FIG. 7A, since the signals RES are at the high level, no charges stay in the FD region (FD), and charges are discharged to a corresponding pixel power source line. The reason why the potential barrier formed in the signal TX1 is lower than the potential barrier formed in the signal TX2 is that the example in which the transistor composed of the photodiode 2, the signal TX1, and the accumulation portion MEM is the buried channel type one is considered, as described above, here.

Figure 7A:
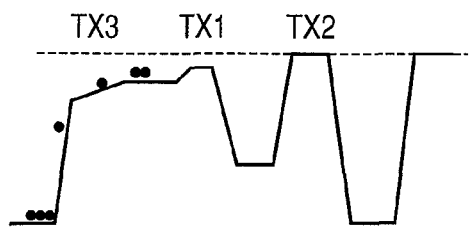
FIGS. 7A, 7B, 7C, 7D, 7E, 7F, and 7G are diagrams illustrating the potential states of a pixel according to the second embodiment.
Figure 7E:
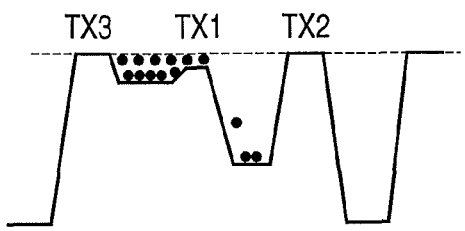
Figure 7B:
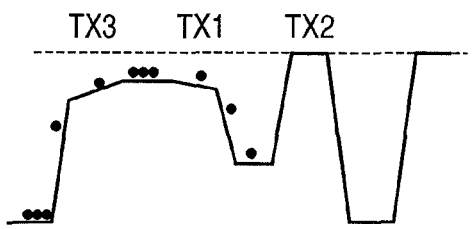

When the signals TX1(n)-TX1(n+2) change to the high level at the time t0, the potential state of the pixel becomes the one illustrated in FIG. 7B. In this period, since no potential barriers are formed in the signal TX1 corresponding to the first transfer portion between the photodiode 2 and the accumulation portion MEM, the charges generated in the photodiode 2 move to the OFD or the accumulation portion MEM. Although it is not illustrated in FIG. 7B, since the signals RES are at the high level, the charges moved into the FD are discharged to a corresponding pixel power source line.

At the succeeding time t1, the signals TX2(n)-TX2(n+2) change to the high level, and the signals TX3(n)-TX3(n+2) change to the low level. Consequently, the potential state of the pixel becomes the one illustrated in FIG. 7C. A potential barrier is formed in the signal TX3 corresponding to the third transfer portion, and the potential barrier formed in the signal TX2 corresponding to the second transfer portion disappears here. Consequently, the charges generated in the photodiode 2 move to the FD portion through the first transfer portion, the accumulation portion MEM, and the second transfer portion.

When the signals TX2(n)-TX2(n+2) change to the low level at the time t2, then a potential barrier is formed in the signal TX2 corresponding to the second transfer portion. The potential state of the pixel at this time is the one illustrated in FIG. 7D. As apparent from FIG. 7D, since the charges generated in the photodiode 2 stays in the region of from the photodiode 2 to the accumulation portion MEM in this state, the start of an accumulation period of the pixel, that is the start of the operation of accumulating charges in the pixel, can be defined by the time t2.

When the signals TX1(n)-TX1(n+2) change to the low level at the time t3 after the start of the accumulation period, a potential barrier is formed in the signal TX1 corresponding to the first transfer portion. However, as illustrated in FIG. 7E, since the potential barrier formed in the signal TX1 is lower than the one formed in the signal TX3, the charges exceeding the potential barrier formed in the signal TX1 among the charges generated in the photodiode 2 move to the accumulation portion MEM.

Figure 7F:
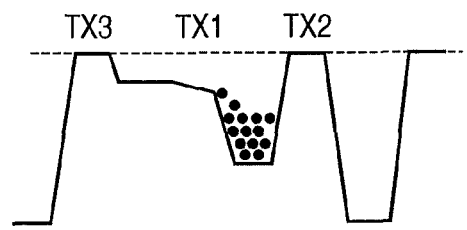
Figure 7C:
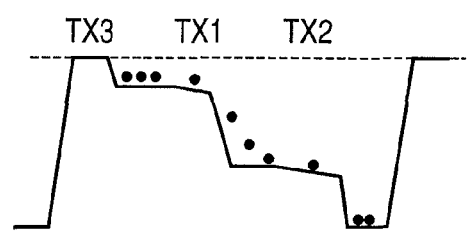
Figure 7G:
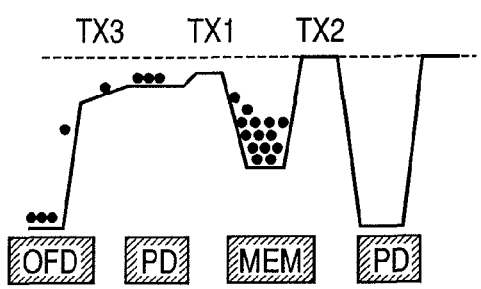
Figure 7D:
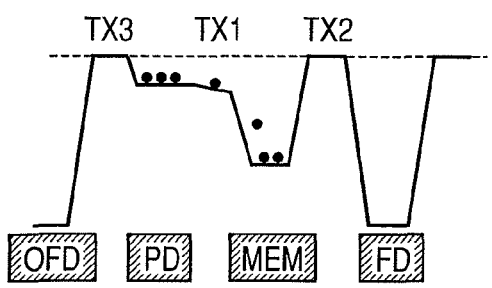

Then, when the signals TX1(n)-TX1(n+2) change to the high level at the time t4 again, the potential state of the pixel becomes the one illustrated in FIG. 7F, and the charges that do not exceed the potential barrier formed in the signal TX1 in the period of from the time t3 to the time t4 move to the accumulation portion MEM.

Then, the signals TX1(n)-TX1(n+2) change to the low level at the time t5, and the signals TX3(n)-TX3(n+2) change to the high level in place of the changes of the signals TX1(n)-TX1(n+2). The potential state of the pixel at this time is the one illustrated in FIG. 7G. A potential barrier is formed in the signal TX1 corresponding to the first transfer portion, and the potential barrier formed in the signal TX3 corresponding to the third transfer portion disappears. Consequently, the charges generated in the photodiode 2 do not move to the accumulation portion MEM, but are discharged to the OFD. Therefore, the end of the accumulation period of the pixel can be defined by this timing.

After that, when the signal TX2(n) changes to the high level at the time t7 during the period of from the time t6 to a time t8, during which the signals RES(n) are at the low level, then the charges held in the accumulation portion MEM of each of the pixels in the $n^{th}$ row are transferred to the FD region of the pixel through the second transfer portion TX2. Since the selecting portion of the pixel is in its on-state at least at this timing, the voltage level according to the charge quantity transferred to the FD region appears onto a corresponding vertical signal line by the source follower circuit composed of the amplifying transistor 12 and the constant current source. The signal according to the voltage level appearing on the vertical signal line is output from the output circuit 104.

Similar operations are performed also to the pixels in the $(n+1)^{st}$ row and $(n+2)^{nd}$ row, and the signals corresponding to the pixels in the respective rows are output from the output circuit 104. The operation for one frame of realizing the in-surface synchronous electronic shutter is completed by the above operations.

Although the signals RES keep the high level except for the periods of reading out signals from the pixels in each of the rows in the operation illustrated in FIG. 4, the signals RES may be changed to the high level in pulses before the signals TX2 change to the high level.

The driving method according to the present embodiment makes the operation of accumulating charges start simultaneously in a plurality of lines of pixels arranged in a matrix by changing the signal TX2 to the low level under the condition in which the signal TX3 is at the low level and the signals TX1 and TX2 are at the high level. Furthermore, the signal TX1 is made to be at the low level. According to the driving method of the present embodiment, even if charges are generated in a photodiode more than the quantity capable of being accumulated in the photodiode, the start of the accumulation period of the charges can be suitably defined. Moreover, according to the present embodiment, the differences of the influences of dark currents and incident lights can be reduced.

(Others)

Figure 8:
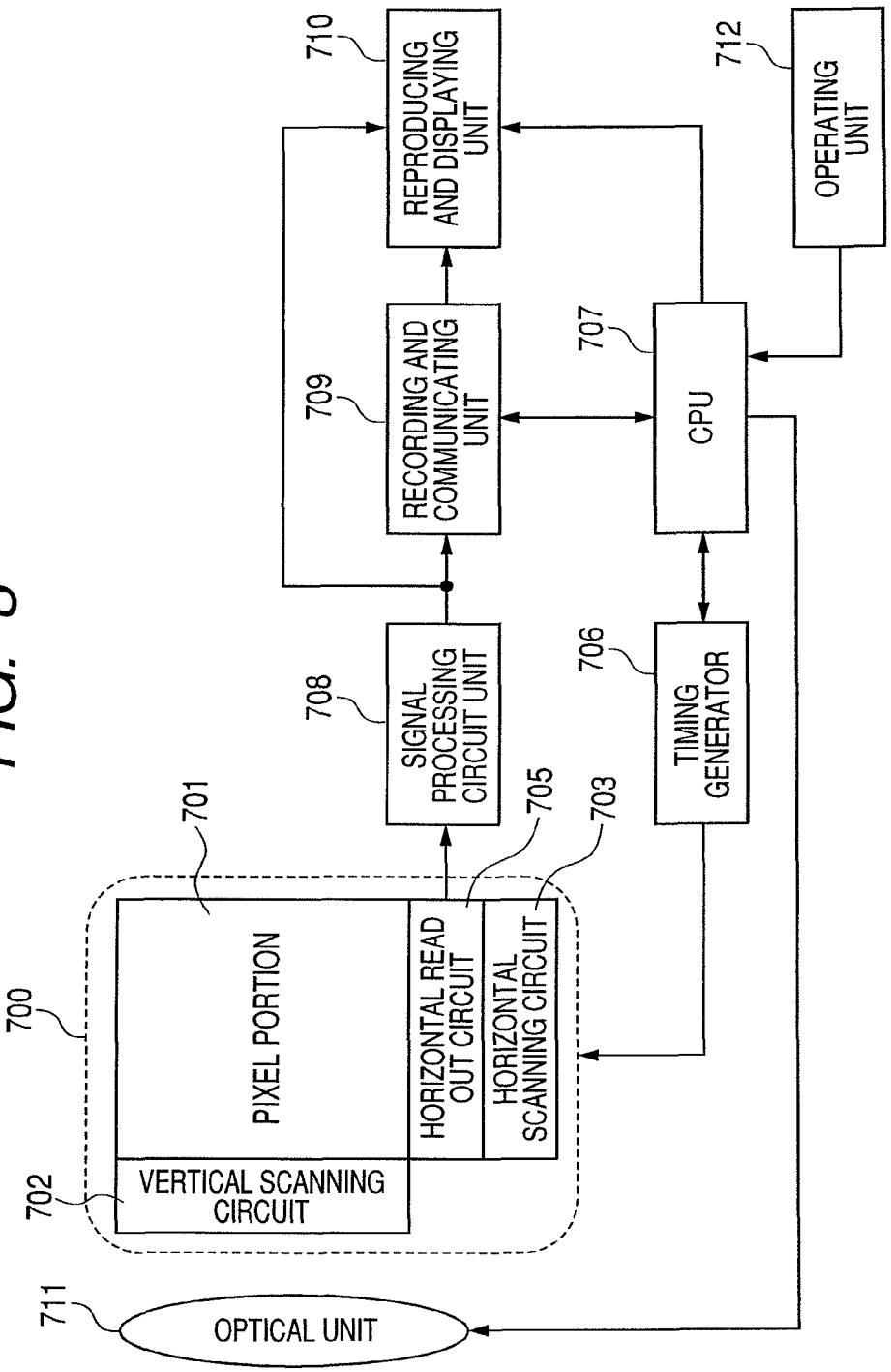
FIG. 8 is a diagram illustrating the schematic configuration of an imaging system.

FIG. 8 is a diagram illustrating the schematic configuration of an imaging system, which, for example, includes an optical unit 711, a solid-state imaging apparatus 700, a signal processing circuit unit 708, a recording and communicating unit 709, a timing generator 706, a central processing unit (CPU) 707, a reproducing and displaying unit 710, and an operating unit 712.

The optical unit 711, which is an optical system such as a lens, focuses the lights of an object on a pixel portion 701, on which a plurality of pixels are two-dimensionally arranged, of the solid-state imaging apparatus 700 to form an image of the object thereon. The pixel portion 701 includes the aforesaid imaging region 101. The solid-state imaging apparatus 700 outputs signals according to the lights of the image formed in the pixel portion 701 at the timing based on the signals input from the timing generator 706.

The solid-state imaging apparatus 700 includes the pixel portion 701 corresponding to the imaging region 101 of FIG. 1 and a horizontal read out circuit 705 equipped with a holding portion, which temporarily holds a signal output from each pixel in the pixel portion 701 to a vertical signal line. The horizontal read out circuit 705 may include an output portion corresponding to the output circuit 104 illustrated in FIG. 1. The solid-state imaging apparatus 700 further includes a vertical scanning circuit 702 for selecting a row of the pixels in the pixel portion 701 and a horizontal scanning circuit 703 for controlling the horizontal read out circuit 705 to output a signal as a sensor signal output.

A signal output from the solid-state imaging apparatus 700 is input into the signal processing circuit unit 708, which is a signal processing portion, and the signal processing circuit unit 708 performs the processing, such as an AD conversion, to the input electric signal in accordance with a method regulated by a program or the like. The signal obtained by the processing in the signal processing circuit unit 708 is transmitted to the recording and communicating unit 709 as image data. The recording and communicating unit 709 transmits a signal for forming an image to the reproducing and displaying unit 710 to make the reproducing and displaying unit 710 reproduce and display a moving image or a still image. The recording and communicating unit 709 receives a signal from the signal processing circuit unit 708 to perform an operation of recording a signal for forming an image onto a recording medium (not illustrated) besides communicating with the CPU 707.

The CPU 707 collectively controls the operation of the imaging system and outputs control signals for controlling the drives of the optical unit 711, the timing generator 706, the recording and communicating unit 709, and the reproducing and displaying unit 710. Moreover, the CPU 707 is equipped with a storage device (not illustrated), such as a recording medium, in which the programs necessary for controlling the operation of the imaging system are recorded. The CPU 707 outputs a drive mode instruction signal and a photographing instruction signal to the timing generator 706. Incidentally, the drive mode instruction signal and the photographing instruction signal may not be the signals different from each other, but may be a single signal.

When the timing generator 706 receives the drive mode instruction signal and the photographing instruction signal from the CPU 707, the timing generator 706 supplies signals to the vertical scanning circuit 702 and the horizontal scanning circuit 703 so as to operate the solid-state imaging apparatus 700 in a drive mode according to the signals.

For example, the CPU 707 supplies the drive mode instruction signal and the photographing instruction signal to the timing generator 706 so as to perform photographing in a drive mode according to the in-surface synchronous electronic shutter. The timing generator 706 hereby supplies the signals for performing the operation of the in-surface synchronous electronic shutter to the solid-state imaging apparatus 700. When the solid-state imaging apparatus 700 receives the signals, for example, the solid-state imaging apparatus 700 is driven at the timings illustrated in FIG. 4 to output the signals the accumulations times of which are the same in the imaging surface to the processing circuit unit 708.

Moreover, for example, the CPU 707 supplies the drive mode instruction signal and the photographing instruction signal to the timing generator 706 so as to perform photographing in a drive mode of a rolling electronic shutter. The timing generator 706 hereby supplies a signal for performing the operation of a rolling electronic shutter to the solid-state imaging apparatus 700. When the solid-state imaging apparatus 700 receives the signal, the solid-state imaging apparatus 700 is driven by the timing illustrated in FIG. 8, for example, and outputs signals the accumulation periods of which in an imaging surface are different at each row of the pixels to the signal processing circuit unit 708.

The operating unit 712 is an interface that a user operates, and outputs an operation signal according to an operation of the user to the CPU 707. To put it more concretely, the operating unit 712 enables the switching of the mode of photographing a moving image and the mode of photographing a still image, and the determination of the timing of a shutter.

The reproducing and displaying unit 710 is a unit for displaying input image data as an image, and, for example, the reproducing and displaying unit 710 can display the image data held in a recording medium (not illustrated) as an image through the recording and communicating unit 709. Moreover, if the imaging system is used as an electronic view finder (EVF), the imaging system can display the image data supplied from the signal processing circuit unit 708 as an image without using the recording and communicating unit 709.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-125878, filed May 13, 2008, which is hereby incorporated by reference herein its entirety.

What is claimed is:

1. A driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer portion connecting the photoelectric conversion portion to the accumulation portion, a second transfer portion connecting the accumulation portion to a floating diffusion portion, and a third transfer portion connecting the photoelectric conversion portion to a power source, wherein, at least during a period in which the pixel accumulates the charge, a barrier formed in the first transfer portion with respect to the charge accumulated in the accumulation portion has a height not higher than a height of a barrier formed in the third transfer portion, and wherein the driving method comprises steps of:
 forming a potential barrier in the second transfer portion, from a state where the potential barrier is not formed in the second transfer portion;
 reading out a signal level according to the floating diffusion portion;
 forming, from a state where no potential barrier is formed, the potential barrier in the second transfer portion, under a condition that the potential barrier is formed in the first transfer portion and no potential barrier is formed in the third transfer portion; and forming the potential barrier in the third transfer portion.

2. The driving method according to claim 1, wherein
the operation of accumulating the charge in the pixels starts simultaneously in all of the pixels in the pixel portion.

3. The driving method according to claim 1, wherein
the solid-state imaging apparatus further includes a reset portion connecting the floating diffusion portion to the power source, so as not to form the potential barrier in the reset portion under a condition that the potential barrier is not formed in the second transfer portion.

4. A driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion, and a third transfer transistor for transferring the charge generated in the photoelectric conversion portion to a power source, wherein the first transfer transistor is a buried channel type transistor, and the driving method comprises steps of:

changing, from a high level to a low level, a signal supplied to a control electrode of the second transfer transistor;

reading out a signal level according to the floating diffusion portion;

changing, from a high level to a low level, a signal supplied to a control electrode of the second transfer transistor under a condition that a control electrode of the first transfer transistor is supplied with a signal of a low level while a control electrode of the third transfer transistor is supplied with a signal of a high level; and changing to a low level the signal supplied to the control electrode of the third transfer transistor.

5. The driving method according to claim 4, wherein
the solid-state imaging apparatus further includes a reset transistor for connecting the floating diffusion portion to the power source, and a control electrode of the reset transistor is supplied with a signal of high level when the signal supplied to the control electrode of the second transfer transistor is at a high level.

6. The driving method according to claim 4, wherein
the operation of accumulating the charge in the pixels starts simultaneously in all of the pixels in the pixel portion.

7. The driving method according to claim 4, wherein
the solid-state imaging apparatus further includes a reset portion connecting the floating diffusion portion to the power source, so as not to form a potential barrier in the reset portion under a condition that the potential barrier is not formed in the second transfer transistor.

8. A driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer portion connecting the photoelectric conversion portion to the accumulation portion, a second transfer portion connecting the accumulation portion to a floating diffusion portion and a third transfer portion connecting the photoelectric conversion portion to a power source, wherein, at least during a part of a period of accumulating the charge in the pixel, a barrier formed in the first transfer portion with respect to the charge accumulated in the accumulation portion has a height not higher than a height of a barrier formed in the third transfer portion, and wherein the driving method comprises steps of:

forming a potential barrier in the second transfer portion, from a state where the potential barrier is not formed in the second transfer portion;

reading out a signal level according to the floating diffusion portion;

forming, from a state where no potential barrier is formed, the potential barrier in the second transfer portion, under a condition that the potential barrier is formed in the third transfer portion and no potential barrier is formed in the first and second transfer portions; and forming the potential barrier in the first transfer portion.

9. The driving method according to claim 8, wherein
the operation of accumulating the charge in the pixels starts simultaneously in all of the pixels in the pixel portion.

10. The driving method according to claim 8, wherein
the solid-state imaging apparatus further includes a reset portion connecting the floating diffusion portion to the power source, so as not to form the potential barrier in the reset portion under a condition that the potential barrier is not formed in the second transfer portion.

11. A driving method of a solid-state imaging apparatus, wherein the solid-state imaging apparatus comprises a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion, and a third transfer transistor for transferring the charge generated in the photoelectric conversion portion to a power source, wherein the first transfer transistor is a buried channel type transistor, and the driving method comprises steps of:

changing, from a high level to a low level, a signal supplied to a control electrode of the second transfer transistor;

reading out a signal level according to the floating diffusion portion;

changing, from a high level to a low level, a signal supplied to a control electrode of the second transfer transistor under a condition that a control electrode of the third transfer transistor is supplied with a signal of a low level while control electrodes of the first and second transfer transistors are supplied with a signal of a high level; and changing to a low level the signal supplied to the control electrode of the first transfer transistor.

12. The driving method according to claim 11, wherein
the solid-state imaging apparatus further includes a reset transistor for connecting the floating diffusion portion to the power source, and a control electrode of the reset transistor is supplied with a signal of high level when the signal supplied to the control electrode of the second transfer transistor is at a high level.

13. The driving method according to claim 11, wherein
the operation of accumulating the charge in the pixels starts simultaneously in all of the pixels in the pixel portion.

14. A solid-state imaging apparatus comprising:
a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion and a third transfer transistor for transferring the charge generated in the photoelectric conversion portion to a power source, and a control portion for supplying a signal to control electrodes of the first, second and third transfer transistors,
wherein the first transfer transistor is a buried channel type transistor; and
the control portion controls to:
change, from a high level to a low level a signal supplied to a control electrode of the second transfer transistor;
read out a signal level according to the floating diffusion portion;
change, from a high level to a low level, a signal supplied to the control electrode of the second transfer transistor under a condition that the control electrode of the first transfer transistor is supplied with a signal of a low level while the control electrode of the third transfer transistor is supplied with a signal of a high level; and
change to a low level the signal supplied to the control electrode of the third transfer transistor.

15. The solid-state imaging apparatus according to claim 14, wherein
the control portion controls the operation of accumulating the charge in the pixels so as to be started simultaneously in all of the pixels in the pixel portion.

16. The solid-state imaging apparatus according to claim 14, wherein
the solid-state imaging apparatus further includes a reset portion connecting the floating diffusion portion to the power source, and the control portion controls so as not to form a potential barrier in the reset portion under a condition that the potential barrier is not formed in the second transfer portion.

17. A solid-state imaging apparatus comprising:
a pixel portion comprising a plurality of pixels arranged in a matrix, each pixel includes a photoelectric conversion portion for photoelectrically converting an incident light into a charge, an accumulation portion for accumulating the charge, a first transfer transistor for transferring the charge generated in the photoelectric conversion portion to the accumulation portion, a second transfer transistor for transferring the charge accumulated in the accumulation portion to a floating diffusion portion and a third transfer transistor for transferring the charge generated in the photoelectric conversion portion to a power source, and a control portion for supplying a signal to control electrodes of the first, second and third transfer transistors,
wherein the first transfer transistor is a buried channel type transistor; and
the control portion controls to:
change, from a high level to a low level, a signal supplied to a control electrode of the second transfer transistor;
read out a signal level according to the floating diffusion portion;
change, from a high level to a low level, a signal supplied to the control electrode of the second transfer transistor under a condition that the control electrode of the third transfer transistor is supplied with a signal of a low level while the control electrodes of the first and second transfer transistors are supplied with a signal of a high level; and
change to a low level the signal supplied to the control electrode of the first transfer transistor.

18. The solid-state imaging apparatus according to claim 17, wherein
the solid-state imaging apparatus includes further a reset transistor connecting the floating diffusion portion to the power source, and the control portion controls to supply a signal of a high level to the control electrode of the reset transistor under a condition that the control electrode of the second transfer portion is supplied with a signal of high level.

19. The solid-state imaging apparatus according to claim 17, wherein
the control portion controls the operation of accumulating the charge in the pixels so as to be started simultaneously in all of the pixels in the pixel portion.

20. The solid-state imaging apparatus according to claim 17, wherein
the solid-state imaging apparatus further includes a reset portion connecting the floating diffusion portion to the power source, and the control portion controls so as not to form a potential barrier in the reset portion under a condition that the potential barrier is not formed in the second transfer transistor.

* * * * *